(12) United States Patent
Lee et al.

(10) Patent No.: US 9,236,500 B2
(45) Date of Patent: Jan. 12, 2016

(54) SCHOTTKY BARRIER DIODE AND METHOD FOR MANUFACTURING SCHOTTKY BARRIER DIODE

(71) Applicant: Hyundai Motor Company, Seoul (KR)

(72) Inventors: Jong Seok Lee, Suwon (KR); Kyoung-Kook Hong, Hwaseong (KR); Dae Hwan Chun, Gwangmyung-si Gyeonggi-Do (KR); Youngkyun Jung, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/143,735

(22) Filed: Dec. 30, 2013

(65) Prior Publication Data

US 2015/0069412 A1   Mar. 12, 2015

(30) Foreign Application Priority Data

Sep. 10, 2013   (KR) .......................... 10-2013-0108479

(51) Int. Cl.
| | |
|---|---|
| *H01L 29/06* | (2006.01) |
| *H01L 29/872* | (2006.01) |
| *H01L 29/66* | (2006.01) |
| *H01L 29/16* | (2006.01) |

(52) U.S. Cl.
CPC .......... *H01L 29/872* (2013.01); *H01L 29/6606* (2013.01); *H01L 29/66143* (2013.01); *H01L 29/0619* (2013.01); *H01L 29/0661* (2013.01); *H01L 29/1608* (2013.01)

(58) Field of Classification Search
CPC .............. H01L 29/1608; H01L 29/872; H01L 29/0619; H01L 29/0657; H01L 29/66143; H01L 21/02529; H01L 21/046; H01L 21/0495
See application file for complete search history.

(56) References Cited

U.S. PATENT DOCUMENTS

| | | | | |
|---|---|---|---|---|
| 3,742,317 | A * | 6/1973 | Shao .............................. | 257/484 |
| 6,844,251 | B2 * | 1/2005 | Shenai et al. .................. | 438/571 |
| 7,101,739 | B2 * | 9/2006 | Lanois ........................... | 438/141 |
| 2008/0191304 | A1 | 8/2008 | Zhang et al. | |
| 2011/0062450 | A1* | 3/2011 | Gammon et al. ............... | 257/77 |
| 2013/0065382 | A1* | 3/2013 | Nishio et al. .................. | 438/522 |

FOREIGN PATENT DOCUMENTS

| | | |
|---|---|---|
| JP | 62-136072 | 6/1987 |
| JP | 09-64381 | 3/1997 |
| KR | 10-0212203 B1 | 8/1999 |
| KR | 10-0231797 B1 | 12/1999 |
| KR | 10-2013-0076314 A | 7/2013 |

* cited by examiner

*Primary Examiner* — Roy Potter
*Assistant Examiner* — Paul Patton
(74) *Attorney, Agent, or Firm* — Mintz Levin Cohn Ferris Glovsky and Popeo, P.C.; Peter F. Corless

(57) ABSTRACT

A Schottky barrier diode and a method of manufacturing the Schottky barrier diode are provided. The diode includes an n– type epitaxial layer disposed on a first surface of an n+ type silicon carbide substrate and having an upper surface, a lower surface, and an inclined surface that connects the upper surface and the lower surface. A p region is disposed on the inclined surface of the n– type epitaxial layer and a Schottky electrode is disposed on the upper surface of the n– type epitaxial layer and the p region. In addition, an ohmic electrode is disposed on a second surface of the n+ type silicon carbide substrate.

9 Claims, 4 Drawing Sheets

SCHOTTKY BARRIER DIODE AND METHOD FOR MANUFACTURING SCHOTTKY BARRIER DIODE

CROSS-REFERENCE TO RELATED APPLICATION

This application claims priority to and the benefit of Korean Patent Application No. 10-2013-0108479 filed in the Korean Intellectual Property Office on Sep. 10, 2013, the entire contents of which are incorporated herein by reference.

BACKGROUND (a) Field of the Invention

The present invention relates to a Schottky barrier diode that includes silicon carbide (SiC) and a method for manufacturing the Schottky barrier diode.

(b) Description of the Related Art

Recently, as size and capacity of applications increase, a need for power semiconductor devices having a high breakdown voltage, a high current, and a rapid switching characteristic has increased. Among the power semiconductor devices, a Schottky barrier diode (SBD) using a Schottky junction, in which a metal and a semiconductor form a junction, without using a P-N junction unlike a general PN diode represents the rapid switching characteristic and has a turn-on voltage characteristic lower than the P-N diode.

The Schottky barrier diode requires a substantially low turn-on resistance or a substantially low saturation voltage to reduce a power loss in a conduction state while providing a flow of substantially large current. Further, the Schottky barrier diode requires a characteristic that withstands a reverse high voltage of the P-N junction which is applied across the Schottky barrier diode in a turn-off state or at the moment that a switch is turned-off, that is, a high breakdown voltage characteristic.

It is known that the breakdown voltage is affected by a curvature of a depletion region and in a planar junction, an edge portion having a curvature less than that of a flat portion of a junction portion is crowded with an electric field due to an electric field crowding effect which crowds an electric field around a portion having a curvature less than that of the flat junction portion. Therefore, a breakdown phenomenon readily occurs at the edge portion and the breakdown voltage determined by the entire depletion region is reduced.

The Schottky barrier diode is formed to have a mesa structure to increase the breakdown voltage by relieving the phenomenon that the electric field is crowded around the edge portion of the junction portion and reducing a surface electric field. The Schottky barrier diode having the mesa structure does not require a termination structure for ion implantation, and the like but requires an etching process to form the mesa structure. In particular, the characteristics of the Schottky barrier diode may deteriorate due to an interface defect during the etching process.

The above information disclosed in this section is merely for enhancement of understanding of the background of the invention and therefore it may contain information that does not form the prior art that is already known in this country to a person of ordinary skill in the art.

SUMMARY

The present invention provides a Schottky barrier diode having a mesa structure which may improve a breakdown voltage characteristic of the Schottky barrier diode.

An exemplary embodiment of the present invention provides a Schottky barrier diode that may include: an n− type epitaxial layer disposed on a first surface of an n+ type silicon carbide substrate and includes an upper surface, a lower surface, and an inclined surface that connects the upper surface and the lower surface; a p region disposed on the inclined surface of the n− type epitaxial layer; a Schottky electrode disposed on the upper surface of the n− type epitaxial layer and the p region; and an ohmic electrode disposed on a second surface of the n+ type silicon carbide substrate.

The n− type epitaxial layer may expose a portion of the first surface of the n+ type silicon carbide substrate and the p region may extend up the first surface of the exposed n+ type silicon carbide substrate. The lower surface of the n− type epitaxial layer may contact the first surface of the n+ type silicon carbide substrate. The lower surface of the n− type epitaxial layer may be longer than the upper surface of the n− type epitaxial layer. An angle formed by the lower surface of the n− type epitaxial layer and the inclined surface of the n− type epitaxial layer may be about 1° to 89°.

Another exemplary embodiment of the present invention provides a method for manufacturing a Schottky barrier diode that may include: forming a reserved n− type epitaxial layer on a first surface of an n+ type silicon carbide substrate; forming an n− type epitaxial layer to expose a portion of the first surface of the n+ type silicon carbide substrate by partially etching both ends of the reserved n− type epitaxial layer, wherein the n− type epitaxial layer includes an upper surface, a lower surface, and a reserved inclined surface that connects the upper surface and the lower surface; forming a p region and an inclined surface of the n− type epitaxial layer under the p region by doping a p type ion on the reserved inclined surface of the n− type epitaxial layer and a portion of the first surface of the exposed n+ type silicon carbide substrate; forming a Schottky electrode on the p region and the upper surface of the n− type epitaxial layer; and forming an ohmic electrode on a second surface of the n+ type silicon carbide substrate. A doping concentration of the p type ion may be about $1\times10^{15}/cm^3$ to $1\times10^{19}/cm^3$.

According to the exemplary embodiments of the present invention, it may be possible to form a depletion region due to a P-N junction, by disposing the p region on the inclined surface of the n− type epitaxial layer having the mesa structure in the Schottky barrier diode. Therefore, it may be possible to prevent a leakage current from flowing while applying a reverse voltage. As a result, it may be possible to improve the breakdown voltage characteristic of the Schottky barrier diode.

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present invention will be described in detail with reference to the accompanying drawings. As those skilled in the art would realize, the described exemplary embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

Figure 1:
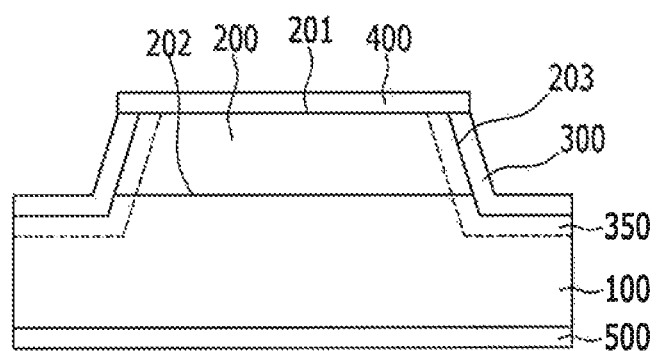
FIG. 1 is an exemplary cross-sectional view of a Schottky barrier diode according to an exemplary embodiment of the present invention.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification, FIG. 1 is an exemplary cross-sectional view of a Schottky barrier diode according to an exemplary embodiment of the present invention. Referring to FIG. 1, the Schottky barrier diode according to the exemplary embodiment of the present invention may include an n+ type silicon carbide substrate 100, an n− type epitaxial layer 200 disposed on a first surface of the n+ type silicon carbide substrate 100, a p region 300, and a Schottky electrode 400. Further, the Schottky barrier diode may include an ohmic electrode 500 disposed on a second surface the n+ type silicon carbide substrate 100 which is an opposite side to the first surface thereof.

The n− type epitaxial layer 200 may have a mesa structure having an upper surface 201, a lower surface 202 longer than the upper surface 201, and an inclined surface 203 that connects the upper surface 201 to the lower surface 202. The lower surface 202 of the n− type epitaxial layer 200 may contact the first surface of the n+ type silicon carbide substrate 100. In particular, an angle formed by the inclined surface 203 and the lower surface 202 may be a range of about 1° to 89°. The n− type epitaxial layer 200 may expose a portion of the first surface of the n+ type silicon carbide substrate 100.

The p region 300 may be disposed on the inclined surface 203 of the n− type epitaxial layer 200 and the first surface of the n+ type silicon carbide substrate 100 exposed by the n− type epitaxial layer 200. The p region 300 may be formed by doping a p type ion on the inclined surface 203 of the n− type epitaxial layer 200 and the first surface of the n+ type silicon carbide substrate 100, in which a doping concentration of the p type ion may be about $1\times10^{15}/cm^3$ to $1\times10^{19}/cm^3$.

The Schottky electrode 400 may be disposed on the upper surface 201 of the n− type epitaxial layer 200 and the p region 300. A depletion region 350 may be formed under the first surface of the silicon carbide substrate 100 on which the inclined surface 203 of the n− type epitaxial layer 200 and the p region 300 may be disposed. The P-N junction may be formed between the p region 300 and the inclined surface 203 of the n− type epitaxial layer 300 and between the p region 300 and the first surface of the n+ type silicon carbide substrate 100. The depletion region 350 may be formed by an internal built-in potential of the P-N junction.

The Schottky barrier diode may not require a termination structure due to the n− type epitaxial layer 200 having the mesa structure, but may cause current leakage current while applying a reverse voltage due to an interface defect which may occur on the inclined surface 203 of the n− type epitaxial layer 200. However, the P-N junction may be formed between the p region 300 and the inclined surface 203 of the n− type epitaxial layer 200 and between the p region 300 and the first surface of the n+ type silicon carbide substrate 100 due to the p region 300 disposed on the inclined surface 203 of the n− type epitaxial layer 200 and the first surface of the n+ type silicon carbide substrate 100, thus causing the depletion region 350 to be formed to prevent the current leakage from flowing while applying the reverse voltage. As a result, it may be possible to improve the breakdown voltage characteristic of the Schottky barrier diode.

Figure 2:
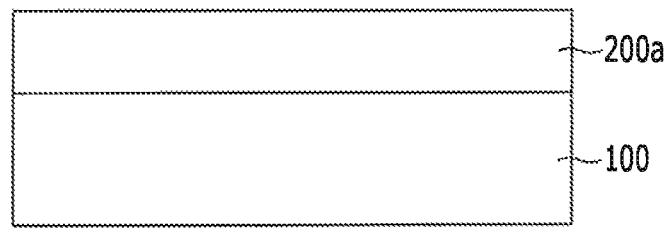
FIGS. 2 to 4 are exemplary views of a method for manufacturing a Schottky barrier diode according to an exemplary embodiment of the present invention.
Figure 3:
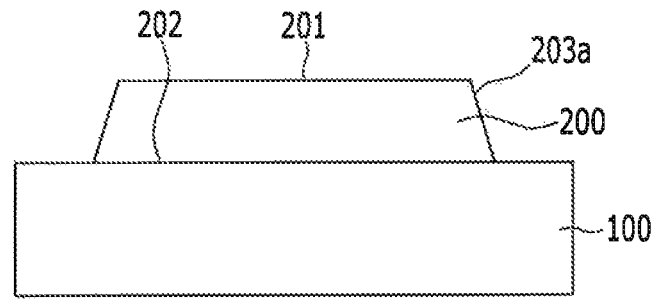
Figure 4:
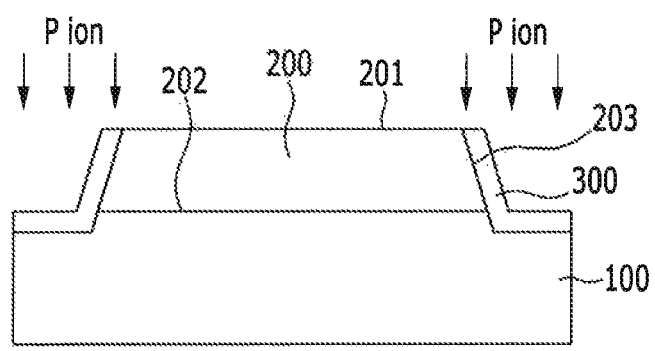

Further, a method for manufacturing a Schottky barrier diode according to an exemplary embodiment of the present invention will be described in detail with reference to FIGS. 1, 2, and 4. FIGS. 2 to 4 are exemplary views of a method for manufacturing a Schottky barrier diode according to an exemplary embodiment of the present invention.

As illustrated in FIG. 2, the n+ type silicon carbide substrate 100 may be prepared and a reserved n− type epitaxial layer 200a may be formed on the first surface of the n+ type silicon carbide substrate 100. In this configuration, the reserved n− type epitaxial layer 200a may be formed on the first surface of the n+ type silicon carbide substrate 100 by epitaxial growth.

As illustrated in FIG. 3, the n− type epitaxial layer 200 may be formed by partially etching both ends of the reserved n− type epitaxial layer 200a. In particular, a portion of the first surface of the n+ type silicon carbide substrate 100 may be exposed. For the etching process, dry etching or wet etching may be performed. For the dry etching process, reactive ion etching (RIE) may be performed and as reactivity etching gas, chloride (Cl) containing gas may be used. The n− type epitaxial layer 200 may have a mesa structure that includes the upper surface 201, the lower surface 202 longer than the upper surface 201, and a reserved inclined surface 203a that connects the upper surface 201 and the lower surface 202. The lower surface 202 of the n− type epitaxial layer 200 may contact the first surface of the n+ type silicon carbide substrate 100. In particular, an angle formed by the reserved inclined surface 203a and the lower surface 202 may be in a range of about 1° to 89°.

Referring to FIG. 4, the p region 300 may be formed by doping the p type ion on the reserved inclined surface 203a of the n− type epitaxial layer 200 and the first surface of the exposed n+ type silicon carbide substrate 100. The doping concentration of the p type ion may be in a range of about $1\times10^{15}/cm^3$ to $1\times10^{19}/cm^3$. The p region 300 may be formed under the reserved inclined surface 203a of the n− type epitaxial layer 200 and on the first surface of the exposed n+ type silicon carbide substrate 100. In particular, the inclined surface 203 of the n− type epitaxial layer 200 that contacts the p region 300 may be formed under the p region 300.

Referring to FIG. 1, the Schottky electrode 400 may be formed on the upper surface 201 of the n− type epitaxial layer 200 and the p region 300 and the ohmic electrode 500 may be formed on the second surface of the n+ type silicon carbide substrate 100 which is an opposite side to the first surface of the n+ type silicon carbide substrate 100. The Schottky electrode 400 may contact the n− type epitaxial layer 200 and the p region 300. In particular, the P-N junction may be formed between the p region 300 and the inclined surface 203 of the n− type epitaxial layer 200 and between the p region 300 and the first surface of the n+ type silicon carbide substrate 100, to form the depletion region 350.

While this invention has been described in connection with what is presently considered to be exemplary embodiments, it is to be understood that the invention is not limited to the disclosed exemplary embodiments, but, on the contrary, is intended to cover various modifications and equivalent arrangements included within the spirit and scope of the appended claims.

| Description of symbols | |
|---|---|
| 100: n + type silicon carbide substrate | 200: n − type epitaxial layer |
| 300: p region | 350: Depletion region |
| 400: Schottky electrode | 500: Ohmic electrode |

What is claimed is:

1. A Schottky barrier diode, comprising:
    an n− type epitaxial layer disposed on a first surface of an n+ type silicon carbide substrate and having an upper surface, a lower surface, and an inclined surface that connects the upper surface and the lower surface;
    a p region disposed on the inclined surface of the n− type epitaxial layer;
    a Schottky electrode disposed on the upper surface of the n− type epitaxial layer and the p region; and
    an ohmic electrode disposed on a second surface of the n+ type silicon carbide substrate,
    wherein the n− type epitaxial layer exposes a portion of the first surface of the n+ type silicon carbide substrate, and the p region extends along the first surface of the exposed n+ type silicon carbide substrate.

2. The Schottky barrier diode of claim 1, wherein the lower surface of the n− type epitaxial layer contacts the first surface of the n+ type silicon carbide substrate.

3. The Schottky barrier diode of claim 2, wherein the lower surface of the n− type epitaxial layer is longer than the upper surface of the n− type epitaxial layer.

4. The Schottky barrier diode of claim 3, wherein an angle formed by the lower surface of the n− type epitaxial layer and the inclined surface of the n− type epitaxial layer is in a range of about 1° to 89°.

5. A method for manufacturing a Schottky barrier diode, comprising:
    forming a reserved n− type epitaxial layer on a first surface of an n+ type silicon carbide substrate;
    forming an n− type epitaxial layer that exposes a portion of the first surface of the n+ type silicon carbide substrate by partially etching both ends of the reserved n− type epitaxial layer, wherein the n− type epitaxial layer includes an upper surface, a lower surface, and a reserved inclined surface that connects the upper surface and the lower surface;
    forming a p region and an inclined surface of the n− type epitaxial layer under the p region by doping a p type ion on the reserved inclined surface of the n− type epitaxial layer and a portion of the first surface of the exposed n+ type silicon carbide substrate;
    forming a Schottky electrode on the p region and the upper surface of the n− type epitaxial layer; and
    forming an ohmic electrode on a second surface of the n+ type silicon carbide substrate,
    wherein the n− type epitaxial layer exposes a portion of the surface of the n+ type silicon carbide substrate, and the p region extends along the first surface of the exposed n+ type silicon carbide substrate.

6. The method of claim 5, wherein a doping concentration of the p type ion is in a range of about $1\times10^{15}/cm^3$ to $1\times10^{19}/cm^3$.

7. The method of claim 6, wherein the lower surface of the n− type epitaxial layer contacts the first surface of the n+ type silicon carbide substrate.

8. The method of claim 7, wherein the lower surface of the n− type epitaxial layer is longer than the upper surface of the n− type epitaxial layer.

9. The method of claim 8, wherein an angle formed by the lower surface of the n− type epitaxial layer and the inclined surface of the n− type epitaxial layer is in a range of about 1° to 89°.

* * * * *